United States Patent
Song et al.

(10) Patent No.: US 9,608,669 B2
(45) Date of Patent: Mar. 28, 2017

(54) LATENCY REDUCED ERROR CORRECTION SCHEME WITH ERROR INDICATION FUNCTION FOR BURST ERROR CORRECTION CODES

(71) Applicant: INTERNATIONAL BUSINESS MACHINES CORPORATION, Armonk, NY (US)

(72) Inventors: Cheng Wei Song, Beijing (CN); Hao Yang, Shanghai (CN); Fan Zhou, Shanghai (CN); Hou Gang Li, Dongxiaokou Town (CN); Yufei Li, Shanghai (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 189 days.

(21) Appl. No.: 14/193,272

(22) Filed: Feb. 28, 2014

(65) Prior Publication Data

US 2014/0245104 A1     Aug. 28, 2014
US 2016/0241259 A9     Aug. 18, 2016

(30) Foreign Application Priority Data

Feb. 28, 2013   (CN) .......................... 2013 1 0064254

(51) Int. Cl.
  *H03M 13/00*   (2006.01)
  *H03M 13/15*   (2006.01)
  (Continued)

(52) U.S. Cl.
  CPC ....... *H03M 13/17* (2013.01); *H03M 13/1525* (2013.01); *H03M 13/1545* (2013.01);
  (Continued)

(58) Field of Classification Search
  CPC .. H03M 13/175; H03M 13/618; H03M 13/17; H03M 13/1525; H03M 13/1545;
  (Continued)

(56) References Cited

U.S. PATENT DOCUMENTS 4,782,490 A  *  11/1988  Tenengolts .................... 714/756
5,381,423 A       1/1995  Ermanno
(Continued)

FOREIGN PATENT DOCUMENTS

CN         101621299         1/2010

*Primary Examiner* — James C Kerveros
(74) *Attorney, Agent, or Firm* — Steven Meyers; Andrew M. Calderon; Roberts Mlotkowski Safran Cole & Calderon, P.C.

(57) ABSTRACT

The present discloses provides a decoding method, decoding apparatus and decoder for correcting burst errors. In particular, the decoding method for correcting burst errors comprises: computing an initial syndrome of a received data frame, wherein the data frame is encoded according to cyclic codes for correcting burst errors; determining error correctability of burst error contained in the data frame based on the computed initial syndrome; and processing the burst error in the data frame and outputting the processed data frame based on the determined error correctability. With the decoding method, decoding apparatus, and decoder of the present invention, error correctability of burst errors contained in a data frame can be determined before the data is send out, while having smaller decoding latency through determining the error correctability and error pattern of the burst errors contained in the data frame using initial syndrome of the data frame.

8 Claims, 10 Drawing Sheets

(51) Int. Cl.
*H03M 13/17* (2006.01)
*H03M 13/35* (2006.01)
*H03M 13/37* (2006.01)

(52) U.S. Cl.
CPC ....... *H03M 13/175* (2013.01); *H03M 13/618* (2013.01); *H03M 13/35* (2013.01); *H03M 13/3746* (2013.01); *H03M 13/6561* (2013.01)

(58) Field of Classification Search
CPC ............. H03M 13/35; H03M 13/3746; H03M 13/6561
USPC .................................................. 714/762, 785
See application file for complete search history.

(56) References Cited

U.S. PATENT DOCUMENTS

| | | | |
|---|---|---|---|
| 5,691,994 A * | 11/1997 | Acosta et al. ................. | 714/784 |
| 6,640,327 B1 * | 10/2003 | Hallberg ............. | H03M 13/152 |
| | | | 714/758 |
| 7,127,660 B2 | 10/2006 | Blaum | |
| 7,231,579 B1 | 6/2007 | Pines et al. | |
| 8,136,013 B2 | 3/2012 | Valliappan et al. | |
| 8,151,165 B2 | 4/2012 | Belogolovy et al. | |
| 8,458,560 B2 * | 6/2013 | Nichols ......................... | 714/762 |
| 2009/0049362 A1 | 2/2009 | Mudulodu | |
| 2009/0187808 A1 | 7/2009 | Nichols | |

* cited by examiner

US 9,608,669 B2

LATENCY REDUCED ERROR CORRECTION SCHEME WITH ERROR INDICATION FUNCTION FOR BURST ERROR CORRECTION CODES

BACKGROUND

The present invention generally relates to data communication field, and more specifically, to decoding method, decoding apparatus and decoder for correcting burst errors.

Recently, with the continual increasing of data transferring rate in communication and networking areas such as high-speed SERDES etc, forward error correction (FEC) tech based on burst error correction cyclic codes is gaining more and more widespread application.

For example, IEEE 802.3ap standard calls for shortened cyclic codes (2112, 2080) capable of correcting burst error of up to 11-bits, wherein 2080 bits are information bits and the remaining 32 bits are parity bits. Typically, the burst error correction codes includes Fire Code, with the generation polynomial $g(x)=(x^{2L-1}+1)\ p(x)$. Where all of the Galois field arithmetic is performed in $GF(2^m)$, where m is the order of the primitive polynomial $p(x)$ and L is a positive integer such that $L<=m$ and $2L-1$ is not divisible by the period of $p(x)$.

At encoder side, by employing linear sequential circuits, the encoding computation can be implemented by using $t(x)=b(x)+x^{n-k}u(x)$, where $t(x)$ is the transmitted encoded data, $u(x)$ is information bits and $b(x)=x^{n-k}u(x)$ mod $g(x)$. Where n is the length of encoded data, k is the length of information bits, and n−k is the length of parity bits.

At decoder side, the decoder generally decodes cyclic codes by the following method.

First, syndrome is generated. For example, the syndrome may be generated by using $s(x)=r(x)$ mod $g(x)$, wherein $r(x)$ is the received code word, and $r(x)=t(x)+e(x)$. Where $e(x)$ is the errors contained in the received data. In particular, when generating syndrome, it is required that the received data is stored into data buffer. Not until the entire frame is received, the syndrome can be generated. It brings about one frame decoding latency for syndrome generation.

Next, the syndrome is detected and is tested for corresponding error pattern. The relationship between the syndrome and error pattern is as below:

$$s(x)=r(x) \bmod g(x)=\{t(x)+e(x)\} \bmod G(x)=e(x) \bmod G(x)$$

If $e(x)$ is gotten, corrected data will be denoted as $c(x)=r(x)+e(x)$.

Finally, after the frame is decoded, the decoder will send the data with a flag indicating correctable or uncorrectable to upper layer. In IEEE802.3ap standard, if it is determined that the current frame is uncorrectable, FEC layer will modify the related sync head of 64B/66B block, e.g., by adding a flag indicating that the error is uncorrectable, such that the upper PCS layer will know that the ongoing frame is corrupted, and then take corresponding reactions. Thus, it's also very important to determine whether the frame is correctable or uncorrectable immediately before sending the data to upper layers.

In prior art, based on different ways to get $e(x)$, many branches of error decoding scheme is developed. A decoding schema, such as Meggitt decoder, requires that not until the error pattern of the entire frame is determined, the correctability of error can be determined. Then the frame is further processed based on the error pattern and whether the frame is correctable. However, the error pattern determining procedure will introduce about one frame latency. Thus, if one wants to determine whether the frame is correctable or uncorrectable before sending it to the upper layer, it requires two frame decoding latency from the reception of the data. Moreover, it further requires a bigger buffer to store 2 complete frames of data.

Another decoder is designed based on Fire Code. Typical Fire Code decoder can be found on book "Error-Correcting Codes", published by MIT press in 1972. Generally, the decoding scheme based on Fire Code requires relatively higher computation capability for receiver, and the decoding latency of using said decoding scheme will generally be more than one frame, the exact latency is related to the period of primitive polynomial $p(x)$.

Thus, a decoding schema that overcomes the above problems of the prior art is needed.

SUMMARY

An objective of the present invention is to provide an improved decoding schema that overcomes the above problems of the prior art.

Thus, the present invention proposes a decoding method, decoding apparatus, and decoder for correcting burst errors. With the decoding method, decoding apparatus, and decoder of the present invention, error correctability of burst errors contained in a data frame can be determined before the data is send out, while having smaller decoding latency through determining the error correctability and error pattern of the burst errors contained in the data frame using initial syndrome of the data frame.

According to one embodiment of the present invention, there is provided a decoding method for correcting burst errors, the method comprising: computing an initial syndrome of a received data frame, wherein the data frame is encoded according to cyclic codes for correcting burst errors; determining error correctability of burst error contained in the data frame based on the computed initial syndrome; and processing the burst error in the data frame and outputting the processed data frame based on the determined error correctability.

According to another embodiment of the present invention, there is provided a decoding apparatus for correcting burst errors, the apparatus comprising: an initial syndrome computing unit, configured for computing an initial syndrome of a received data frame, wherein the data frame is encoded according to cyclic codes for correcting burst errors; an error correctability determining unit, configured for determining error correctability of the burst error contained in the data frame based on the computed initial syndrome; and an error processing unit, configured for processing the burst error in the data frame and output the processed data frame based on the determined error correctability.

According to another embodiment of the present invention, there is provided a decoder for correcting burst errors, the decoder comprising: a data buffer, configured for storing a received data frame, wherein the data frame is encoded according to cyclic codes for correcting burst error; an initial syndrome computing circuit, configured for reading out the data frame from the data buffer and computing an initial syndrome of the data frame; an error correctability determining circuit, comprising a plurality of multiplexers and a XOR gate, and configured for determining error correctability of burst error contained in the data frame based on the initial syndrome computed by the initial syndrome computing circuit; and an error processing circuit, configured for processing the burst error in the data frame and outputting the processed data frame based on the error correctability determined by the error correctability determining circuit.

With the decoding method, decoding apparatus, and decoder of the present invention, error correctability of burst errors contained in a data frame can be determined before the data is send out, while having smaller decoding latency, through determining the error correctability and error pattern of the burst errors contained in the data frame using initial syndrome of the data frame.

BRIEF DESCRIPTION OF THE SEVERAL VIEWS OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
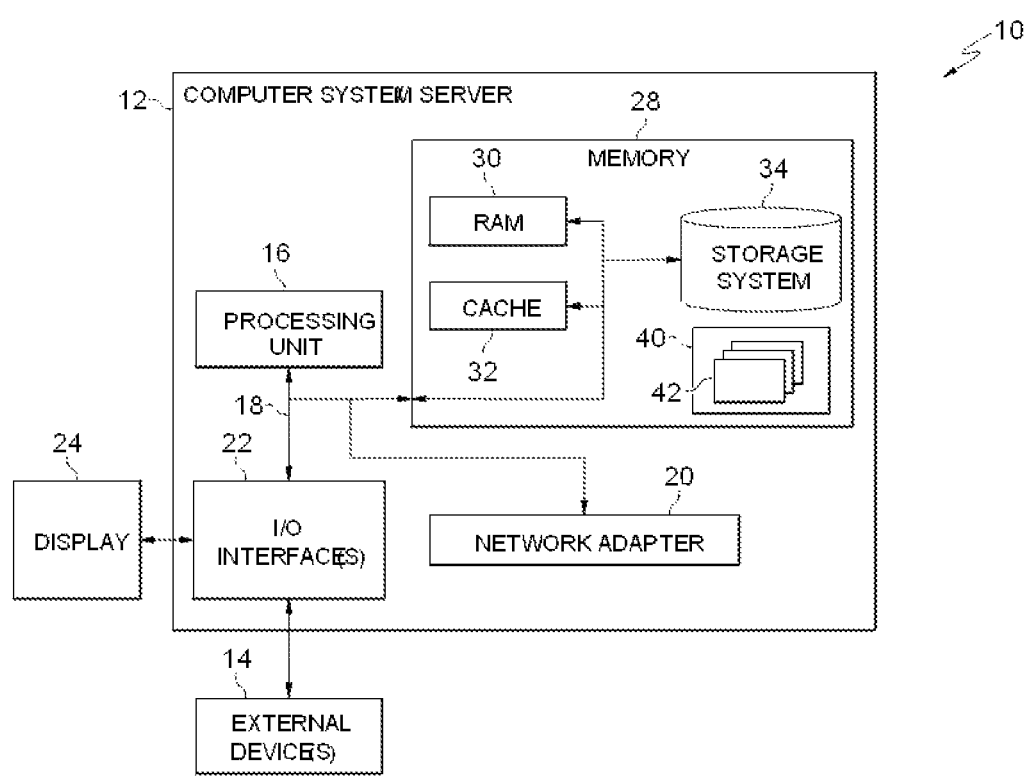
FIG. 1 shows an exemplary computer system/server which is applicable to implement the embodiments of the present invention.

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, in which an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

An objective of the present invention is to provide a decoding scheme, which can determine correctability of burst errors (if there is any) contained in a data frame before the data frame is send out to upper layers, and which also has smaller decoding latency.

Figure 2:
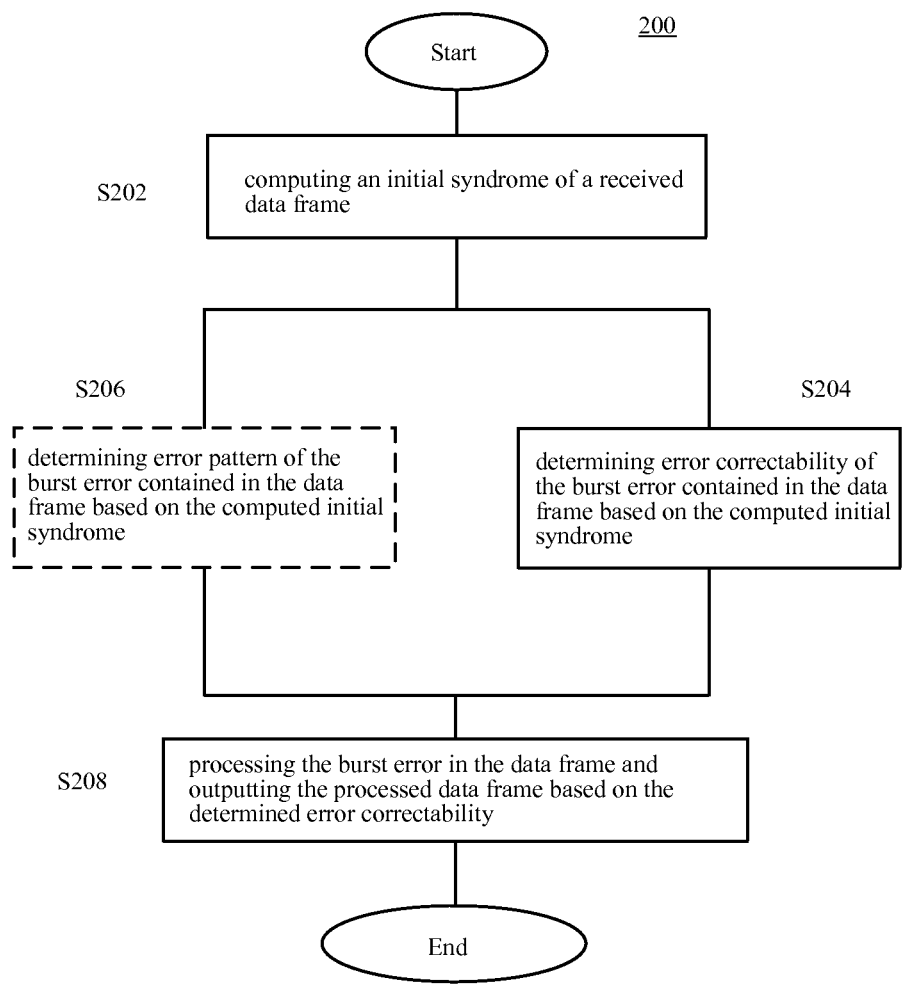
FIG. 2 shows a flow chart of a decoding method for correcting burst errors according to an embodiment of the present invention.

With reference now to FIG. 2 to FIG. 10, the present invention will be described in more detail below. FIG. 2 shows a flow chart of a decoding method 200 for correcting burst errors according to an embodiment of the present invention.

As shown in FIG. 2, first, at step S202, an initial syndrome of a received data frame is computed, wherein the data frame is encoded according to cyclic codes for correcting burst errors.

It should be noted that data frame and cyclic codes can be used exchangeable below. Those in the art will appreciate that if the received code word r(x) (which also can be written in the form of r(n, k) (wherein n denotes the length of the code word, and k denotes the length of information bits)) is divided by generation polynomial g(x) (with its order n–k), the resulting remaining polynomial, also can be referred to as syndrome polynomial s(x) (referred to as initial syndrome hereafter) will be gotten, that is: s(x)=r(x) mod g(x)

Thus, the order of s(x) is lower than that of g(x), that is, s(x) is a polynomial with the order of n–k–1 or less. For example, s(x) may take the form of: $s(x)=a_0+a_1x^1+a_2x^2+ \ldots +a_{n-k-1}x^{n-k-q1}$, wherein $a_i$ is the coefficient of x, and $a_i$ can be 0 or 1.

In an example, the cyclic codes is Fire Code with generation polynomial $g(x)=(x^{2L-1}+1) p(x)$, wherein p(x) is primitive polynomial, all of the Galois field arithmetic is performed in GF($2^m$), where m is the order of p(x) and L is a positive integer such that L<=m and 2L-1 is not divisible by the period of p(x). Where $x^{2L-1}+1$ is defined as error pattern polynomial and p(x) is defined as error location polynomial. L represents the number of the bits of the burst error that can be corrected by said cyclic codes.

Next, at step S204, error correctability of the burst error contained in the data frame is determined based on the initial syndrome computed at step S202. As stated above, the initial syndrome has been obtained at step S202. Thus, it will be beneficial if the relationship between the initial syndrome and the error correctability can be determined, thereby determining whether the error is correctable based on the computed initial syndrome. For the ease of description, IEEE 802.3ap standard will be taken as an example, to derive the relationship between the initial syndrome and the error correctability, thus, it can be determined whether the burst error is correctable based on the initial syndrome.

For IEEE 802.3ap standard, its generate polynomial is:

$$g(x)=x^{32}+x^{23}+x^{21}+x^{11}+x^2+1,$$

it can be factored as:

$$g(x)=(x^{21}+1)(x^{11}+x^2+1),$$

wherein $x^{11}+x^2+1$ is a irreducible primitive polynomial over GF(2), referred to as error location polynomial, and $x^{21}+1$ is error pattern polynomial. This codes can correct a burst error with the length of equal or less than 11.

Suppose there is a burst error with length of 11 bits or less, let the error pattern be $e(x)=x^j B(x)$, where B(x) is a polynomial of degree 10 or less and j is not bigger than n-1. Thus, polynomial B(x) and ($x^{21}+1$), B(x) and ($x^{11}+x^2+1$) are relative prime, and obviously, $x^j$ and ($x^{21}+1$), $x^j$ and ($x^{11}+x^2+1$) are also relative prime. Then, $$r(x)\bmod g(x)=\{t(x)+x^j B(x)\} \bmod g(x)=x^j B(x) \bmod g(x) \ne 0$$

On the other hand, when and only when r(x) is a code word, r(x) can be divided by g(x) with no reminder, so r(x) mod g(x)=0; Now, let $$s_1(x)=r(x)\bmod(x^{21}+1),$$

$$s_2(x)=r(x)\bmod(x^{11}+x^2+1),$$

wherein $s_1(x)$ and $s_2(x)$ are referred to as a first syndrome and a second syndrome respectively. The existing study already shows that the relationship between error correctability of burst error and the first syndrome $s_1(x)$ and the second syndrome $s_2(x)$ is as below:

if $s_1(x)=0$ and $s_2(x)=0$, it shows that no error is detected with the received code word r(x);

if $s_1(x)=0$ and $s_2(x)\ne 0$, or $s_1(x)\ne 0$ and $s_2(x)=0$, it shows that the burst error is uncorrectable;

if $s_1(x)\ne 0$ and $s_2(x)\ne 0$; and the successive 0s in $s_1(x)$ is no more than 10, it shows that the burst error is uncorrectable, otherwise it is correctable.

There is similar deduction for general $g(x)=(x^{2L-1}+1)$ p(x).

With the above derivation, it can be seen that if the first syndrome $s_1(x)$ and the second syndrome $s_2(x)$ can be obtained, whether the burst error contained in the current frame is correctable or uncorrectable can be determined based on the relationship as stated above.

The above explanation shows that the first syndrome $s_1(x)$ and the second syndrome $s_2(x)$ can be computed by applying module operation to the received code word r(x). However, the length of the received code word r(x) is n bits, which causes a large quantity of computations to compute the first syndrome $s_1(x)$ and the second syndrome $s_2(x)$, thereby causing a large latency. It will explain how to compute the first syndrome $s_1(x)$ and the second syndrome $s_2(x)$ based on the initial syndrome s(x) below.

Since s(x)=r(x) mod g(x)=e(x) mod g(x), let e(x)=a(x)g(x)+s(x), then, $s_1(x)$=r(x) mod ($x^{21}+1$)=e(x) mod ($x^{21}+1$)= [a(x)g(x)+s(x)] mod($x^{21}+1$). Since ($x^{21}+1$) is a factor of g(x), $s_1(x)$=s(x) mod ($x^{21}+1$).

For the same reason, $s_2(x)$=r(x) mod ($x^{11}+x^2+1$)=e(x) mod ($x^{11}+x^2+1$), [a(x)g(x)+s(x)] mod ($x^{11}+x^2+1$). Since ($x^{11}+x^2+1$) is a factor of g(x), $s_2(x)$=s(x) mod ($x^{11}+x^2+1$).

From the above, it can be seen that after the initial syndrome s(x) is gotten, the first syndrome $s_1(x)$ and the second syndrome $s_2(x)$ can be computed by applying two module operations to the initial syndrome s(x). For a specific module operation, shift and subtract operations can be used to reduce computation complexity. Thus, after the whole frame is received, some combinational logic can be employed to calculate the first syndrome $s_1(x)$ and the second syndrome $s_2(x)$ when the initial syndrome s(x) is gotten.

Figure 3:
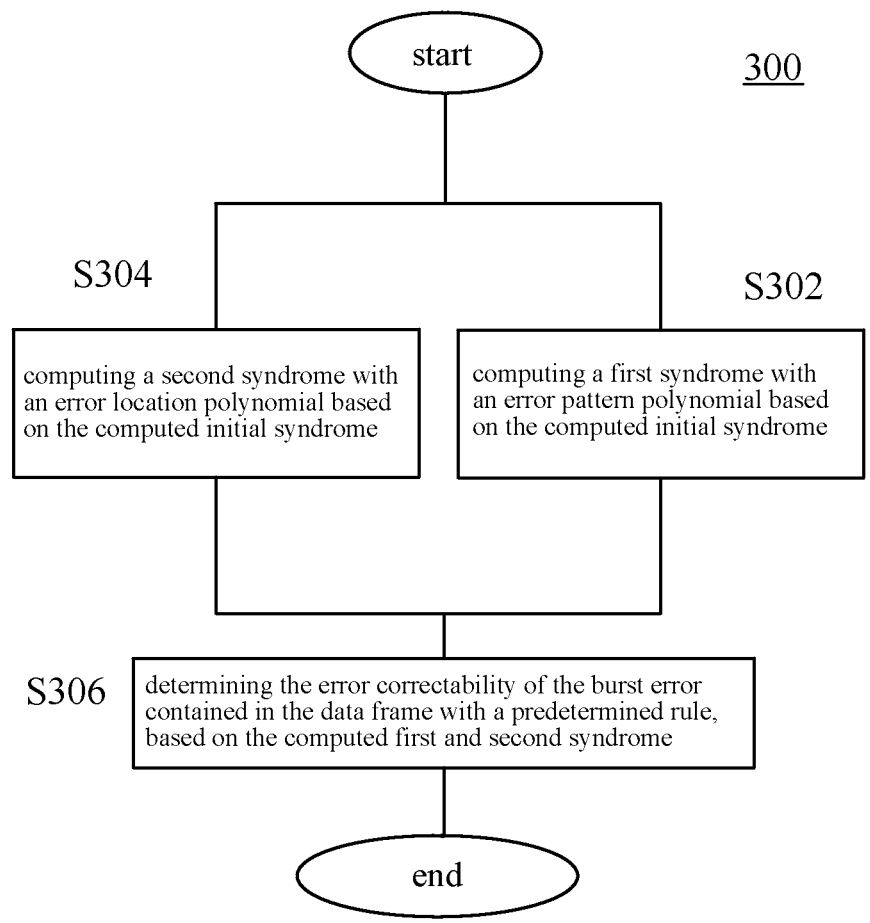
FIG. 3 shows a flow chart of a method for determining error correctability of burst errors contained in a data frame according to an embodiment of the present invention.

FIG. 3 shows a flow chart 300 of the step S204 for determining error correctability of burst errors contained in a data frame according to an embodiment of the present invention. In particular, at step S302, a first syndrome is computed with an error pattern polynomial based on the computed initial syndrome. In particular, computing the first syndrome may comprise: dividing the initial syndrome computed at step S202 by the error pattern polynomial, and determining the remaining polynomial as the first syndrome.

In implementation, dividing the initial syndrome computed at step S202 by the error pattern polynomial comprises: performing shift operation on terms in the initial syndrome computed at step S202 with order higher than the highest order in the error pattern polynomial; and performing subtract operation on results of the shift operation and terms in the initial syndrome with order not higher than the highest order of the error pattern polynomial.

For example, for items in the initial syndrome with order higher than the order 2L-1, shitting them by 2L-1 bits. In particular, in IEEE 802.3ap standard, the term with the highest order of 31 is shifted 21 bits, and so on. The term with order of 21 is also shifted by 21 bits. Then subtract operations are performed on results of the shift operation and items in the initial syndrome with order not higher than the order of 2L-1. For example, the subtract operation can be performed by XOR operation.

At step S304, computing a second syndrome with an error location polynomial based on the initial syndrome computed at step S202. In particular, computing the second syndrome comprises: dividing the initial syndrome computed at step S202 by the error location polynomial, and determining the remaining polynomial as the second syndrome.

In implementation, dividing the initial syndrome computed at step S202 by the error location polynomial comprises: performing shift operation on terms in the initial syndrome computed at step S202 with order higher than the highest order in the error location polynomial; and performing subtract operation on results of the shift operation and items in the initial syndrome with order not higher than the highest order of the error location polynomial.

Shift and subtract operations herein are similar as those described with respect to computing the first syndrome. The difference lies in that, more than one shift operations may be required to shift items in the initial syndrome with order higher than the highest order of the error location polynomial, and that shift and subtract operations may be required to perform iteratively.

At step S306, the error correctability of the burst error contained in the data frame is determined with a predetermined rule, based on the computed first syndrome $s_1(x)$ and second syndrome $s_2(x)$.

In an example, the predetermined rule is as below: if both the first and second syndrome are 0, it shows that no error is detected with the received code word; if only one of the first syndrome and the second syndrome is 0, it shows that the burst error is uncorrectable; if neither of the first syndrome or the second syndrome is 0, and the successive 0s in the first syndrome is no more than the length of the burst error that the cyclic codes can correct minuses 1, it shows that the burst error is uncorrectable, otherwise it is correctable.

In particular, if $s_1(x)=0$ and $s_2(x)=0$, it shows that no error is detected with $r(x)$; if $s_1(x)=0$ and $s_2(x)\neq 0$, or $s_1(x)\neq 0$ and $s_2(x)=0$, it shows that the burst error is uncorrectable; if $s_1(x)\neq 0$ and $s_2(x)\neq 0$, and the successive 0s in $s_1(x)$ is no more than L−1, it shows that the burst error is uncorrectable, otherwise it is correctable.

Given the above, it can be seen that two module operations can be performed to obtain the first syndrome $s_1(x)$ and second syndrome $s_2(x)$, on the basis of the obtained initial syndrome $s(x)$. Then a predetermined rule may be applied to determine whether the burst error contained in the data frame is correctable or uncorrectable. For a specific module operation, in concrete implementation, shift and subtract operations can be used to reduce computation complexity. Thus, after the whole frame is received, some combinational logic can be employed to calculate the first syndrome $s_1(x)$ and the second syndrome $s_2(x)$ when the initial syndrome $s(x)$ is gotten, which will not cause any decoding latency (and which will be small, if there is any). Then a flag indicating whether the data frame is correctable can be send out while the head of the data frame is send out.

The method 208 may also comprise step S208, in which the burst error in the data frame is processed and the processed data frame is outputted based on the determined error correctability. For example, in response to determining that burst error contained in the data frame is correctable, the error is processed and the processed data frame is outputted. In response to determining that burst error contained in the data frame is uncorrectable, a flag indicating that the burst error contained in the data frame is uncorrectable is added to the head of the data frame, and the processed data frame is outputted.

The method 208 may also comprise step S206, in which error pattern of the burst error contained in the data frame is determined based on the initial syndrome computed at step S202. Since the initial syndrome is already gotten, now the relationship between the initial syndrome and the error pattern will be explained, such that the error pattern can be determined based on the initial syndrome computed at step S202.

Let $t(x)$ be the transmitted code word and $r(x)=t(x)+x^z e(x)$ be the received word which is corrupted by an error $e(x)$ starting at the zth bit of $t(x)$. Here, $e(x)$ is a degree m−1 polynomial representing an m-bit burst error pattern. Let $s(x)$ be the initial syndrome generated by $r(x)$. Then, the relationship between $s(x)$ and error pattern is as below:

$$s(x)=r(x)\bmod g(x)=\{t(x)+e(x)\}\bmod g(x)=e(x)\bmod g(x)$$

the matrix theory representation of above is:

$$s(x)=T^z \cdot e(x).$$

T is a nonsingular matrix, the error pattern $e(x)$ is simply given by $$e(x)=T^{-z} \cdot s(x)$$

Thus, $e^0(x)=e(x)=s(x)$, $e^1(x)=T^{-1}\cdot s(x)=T^{-1}e(x)$ and so on, the general form will be $e^{i+1}(x)=T^{-1}\cdot e^i(x)$.

Below will describe steps of computing error pattern after describing the relationship between $s(x)$ and $e(x)$.

(a) Computing candidate error patterns based on the equation $e^{i+1}(x)=T^{-1}\cdot e^i(x)$: Wherein $e^i(x)$ is the ith error pattern candidate, $e^{i+1}(x)$ is the i+1th error pattern candidate; the initial value of $e^i(x)$ is the initial syndrome $s(x)$ computed at step S202; $0\leq i<n-1$, and it is integral times of the data width w, such as 1, w, 2w . . . ; the data width w is determined by the lower and upper levels. For example, w can be 16, 32, 64, etc; the matrix T corresponding to generation polynomial, which can be pre-calculated. The matrix T can take the form of:

$$T = \begin{bmatrix} 0 & 0 & 0 & \ldots & 0 & 0 & 0 & 1 \\ 1 & 0 & 0 & 0 & & 0 & 0 & 0 & g_1 \\ 0 & 1 & & & & 0 & 0 & 0 & g_2 \\ 0 & 0 & 1 & & & 0 & 0 & 0 & g_3 \\ & & & \ldots & & & & & \\ 0 & 0 & 0 & & & & & & g_{n-k-2} \\ 0 & 0 & 0 & 0 & & & & & g_{n-k-1} \end{bmatrix}$$

where $g_i$ is the coefficient of generation polynomial $g(x)$. T is a 32*32 matrix. Since the generation polynomial $g(x)$ is known in advance, T and $T^i$ can be pre-calculated.

(b) determining whether a predetermined iteration end condition is satisfied.

(c) if the predetermined iteration end condition is satisfied, the iteration is stopped, otherwise, the steps (a)-(b) are repeated.

Wherein the predetermined iteration end condition may comprise the successive zeros in the candidate error pattern is equal or larger than a predetermined threshold. In an example, if the successive 0 in a candidate error is equal or larger than 2L−1 (e.g., 21), it shows that a valid error pattern is gotten, and the iteration is stopped.

In one example, processing the burst error in the data frame may comprise processing the burst error in the data frame based on the determined error correctability and error pattern.

In an example, at step S208, the burst error in the data frame is processed based on the determined error correctability and error pattern, and the processed data frame is outputted.

The processing may comprise: in response to determining that burst error contained in the data frame is correctable, the data frame is corrected based on the error pattern $e(x)$ determined at step S206, and the processed data frame is outputted. For example, XOR operations is performed on the received code word $r(x)$ with the error pattern $e(x)$, thereby, the burst error is corrected.

The processing may also comprise: in response to determining that burst error contained in the data frame is uncorrectable, a flag indicating that the burst error contained in the data frame is uncorrectable is added to the head of the data frame, and the processed data frame is outputted with the flag. In an example, if it is determined that the current frame is uncorrectable, the head of the data frame is modified, for example, by adding a flag indicating that the burst error is uncorrectable, such that the upper layer will know that the ongoing frame is corrupted, and take corresponding reactions, such as discard said frame or request for retransmission.

With the decoding method of the present invention, two module operations can be performed to obtain the first syndrome $s_1(x)$ and second syndrome $s_2(x)$, on the basis of the obtained initial syndrome $s(x)$. Then a predetermined rule may be applied to determine whether the burst error contained in the data frame is correctable. Moreover, error pattern can be determined by using matrix multiplication, when the initial syndrome $s(x)$ is gotten, thus, a flag indicating whether the data frame is correctable can be send out while the head of the data frame is send out.

Figure 4:
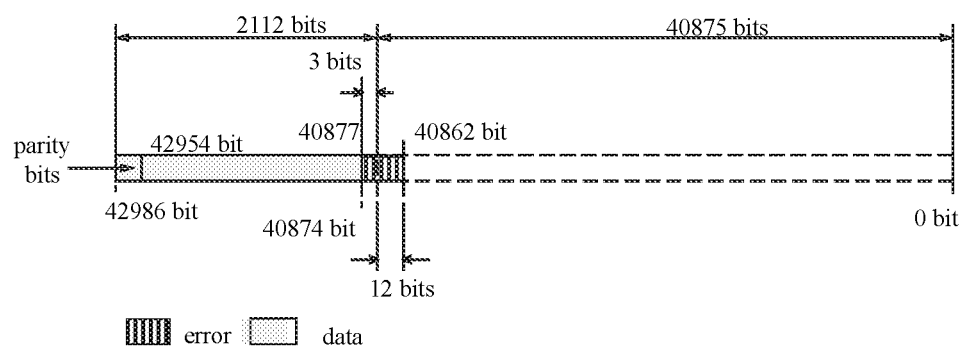
FIG. 4 shows a diagram of fake errors in shorten cyclic codes.

It should be noted that for shorted cyclic codes, carefulness need be taken for fake error which is introduced due to crossing boundary of a shorten frame. Take IEEE 802.3ap standard as an example, as shown in FIG. 4, the (2112, 2080) codes is constructed by shortening the cyclic codes (42987, 42955). Chances are that an uncorrectable errors' syndrome may be same as a syndrome derived from an error which has a less than 11-bit burst error with the error bit position cross the boundary of 2112 bit. Such uncorrectable burst error is referred to as a fake error.

In order to solve the above problem, when the cyclic codes is a shorten cyclic codes, the error correctability determined with the predetermined rule is defined as a first error correctability, and the method 200 further comprises: judging whether the burst error occurs at boundary of the shorten frame of the shorten cyclic codes based on location of the burst error in the data frame; in response to judging that the burst error occurs at boundary of the shorten frame of the shorten cyclic codes, determining a second error correctability; and determining the error correctability of the burst error contained in the data frame based on the determined first and second error correctability.

In the above steps, determining the first and second error correctability can be performed in parallel, and when either of the first and second error correctability is determined as uncorrectable, it is determined that burst error in the data frame is uncorrectable. Alternatively, the first error correctability can be determined first, and in response to the first error correctability is uncorrectable, it is determined that burst error in the data frame is uncorrectable; and in response to the first error correctability is correctable, then the second error correctability is determined, and it is determined that burst error contained in the data frame is correctable or uncorrectable based on whether the second error correctability is correctable or uncorrectable respectively.

Where locations of the burst error in the data frame can be determined based on the error pattern determined at step S206. In particular, it is judged whether there are fakes errors at boundary of the shorten frame based on the valid error pattern determined in first several computations of the error pattern determining.

Fake errors may only exist at several limited locations, for example boundary of the shorten frame. Thus, the second error correctability can be determined by using the valid error pattern determined in first several computations of the error pattern determining, thus, the above steps will not result in much additional computations, and thus, will not result a large additional decoding latency. For example, when the data width is 32 bits, the second error correctability and thus a fake error can be determined by using the valid error pattern determined for the first 32 bits.

Given the above, it can be seen that for shorten cyclic codes, it can determine whether the burst error contained in the data frame is correctable based on the first and second error correctability after the initial syndrome is gotten. However, it will not result in many additional complex computations and a large decoding latency when compared with non-shorten cyclic codes.

Given the above, both for cyclic codes and shorten cyclic codes, the error correctability of burst error contained in a data frame can be determined with a small amount of computations and a small decoding latency. Thus, a flag indicating whether the burst error contained in the data frame is correctable can be send out while the head of the data frame is send out. Thus, with the decoding method of the present invention, the error correctability of burst error contained in a data frame can be determined before the data frame is send out, and the decoding latency is also smaller.

Figure 5:
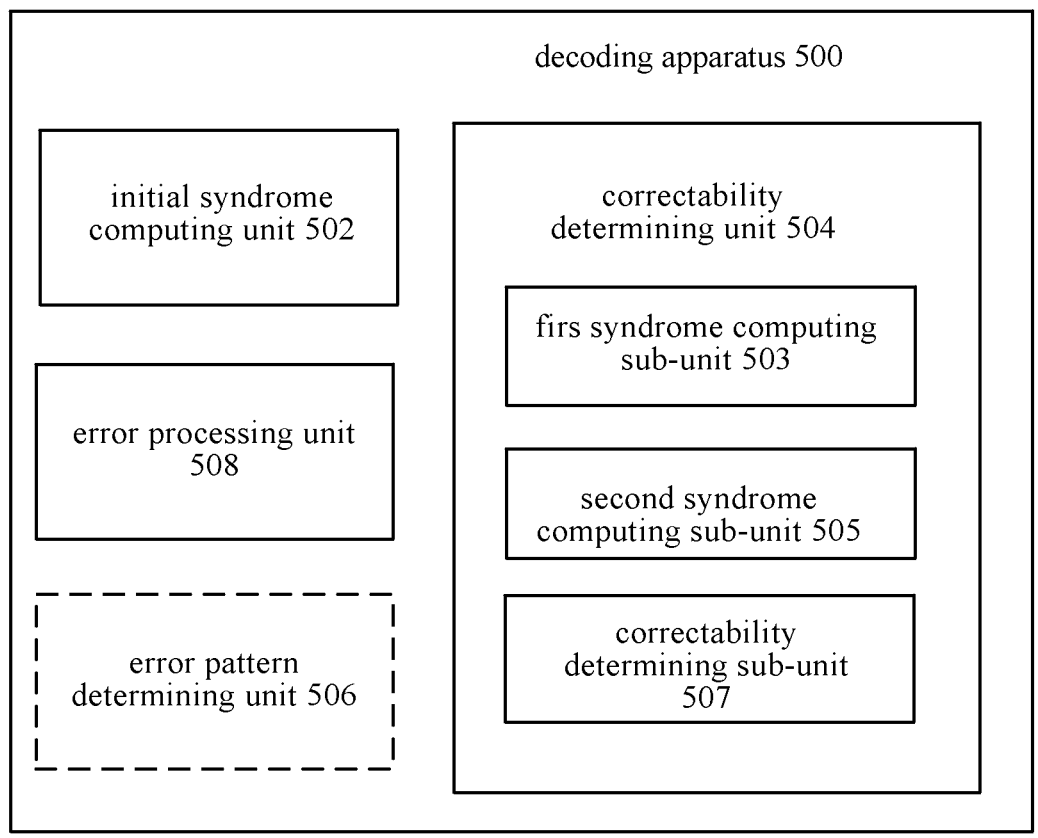
FIG. 5 shows a block diagram of a decoding apparatus for correcting burst errors according to an embodiment of the present invention.

FIG. 5 shows a block diagram of a decoding apparatus 500 for correcting burst errors according to an embodiment of the present invention. As shown in FIG. 5, the decoding apparatus 500 comprises: an initial syndrome computing unit 502, configured for computing an initial syndrome of a received data frame, wherein the data frame is encoded according to cyclic codes for correcting burst errors; an error correctability determining unit 504, configured for determining error correctability of the burst error contained in the data frame based on the computed initial syndrome; and an error processing unit 508, configured for processing the burst error in the data frame and outputting the processed data frame based on the determined error correctability.

In an example, the error correctability determining unit 504 comprises: a first syndrome computing sub-unit 503, configured for computing a first syndrome with an error pattern polynomial based on the initial syndrome computed by the initial syndrome computing unit 502; a second syndrome computing sub-unit 505, configured for computing a second syndrome with an error location polynomial based on the initial syndrome computed by the initial syndrome computing unit 502, wherein the error pattern polynomial and the error location polynomial are associated with generation polynomial of the cyclic codes; and an error correctability determining sub-unit 507, configured for determining error correctability of the burst error contained in the data frame with a predetermined rule based on the first syndrome computed by the first syndrome computing sub-unit 503 and the second syndrome computed by the second syndrome computing sub-unit 505.

In an example, the first syndrome computing sub-unit 503 comprises: a unit configured for dividing the initial syndrome computed by the initial syndrome computing unit 502 by the error pattern polynomial, and a unit configured for determining the remaining polynomial as the first syndrome. In an example, the unit configured for dividing the initial syndrome computed by the initial syndrome computing unit 502 by the error pattern polynomial comprises: a unit configured for performing shift operation on terms in the initial syndrome computed by the initial syndrome computing unit 502 with order higher than the highest order in the error pattern polynomial; and a unit configured for performing subtract operation on results of the shift operation and terms in the initial syndrome with order not higher than the highest order of the error pattern polynomial.

In an example, the second syndrome computing sub-unit 505 comprises: a unit configured for dividing the initial syndrome computed by the initial syndrome computing unit 502 by the error location polynomial, and a unit configured for determining the remaining polynomial as the second syndrome. In an example, the unit configured for dividing the initial syndrome computed by the initial syndrome computing unit 502 by the error location polynomial comprises: a unit configured for performing shift operation on terms in the initial syndrome computed by the initial syndrome computing unit 502 with order higher than the highest order in the error location polynomial; and a unit configured for performing subtract operation on results of the shift operation and items in the initial syndrome with order not higher than the highest order of the error location polynomial.

In an example, the decoding apparatus 500 further comprises an error pattern determining unit 506, configured for determining error pattern of the burst error contained in the data frame based on the computed initial syndrome. In an example, processing the burst error in the data frame comprises processing the burst error in the data frame based on the error correctability determined by the error correctability determining unit 504 and the error pattern determined by the error pattern determining unit 506.

In an example, when the cyclic codes is shorten cyclic codes, the error correctability determined with the predetermined rule is defined as a first error correctability, and the error correctability determining unit 504 further comprises: a burst error location judging unit, configured for judging whether the burst error occurs at boundary of the shorten frame of the shorten cyclic codes based on location of the burst error in the data frame; a second error correctability determining unit, configured for in response to judging that the burst error occurs at boundary of the shorten frame of the shorten cyclic codes, determining a second error correctability; and an error correctability executing unit, configured for determining error correctability of the burst error contained in the data frame based on the determined first and second error correctability. However, it will not result in many additional complex computations and a large additional decoding latency when compared with non-shorten cyclic codes.

Given the above, both in the case of cyclic codes and shorten cyclic codes, the error correctability of burst error contained in data frame can be determined with a small amount of computations and a small decoding latency. Thus, a flag indicating whether the data frame is correctable can be send out while the head of the data frame is send out. Thus, with the decoding apparatus of the present invention, the error correctability of burst error contained in a data frame can be determined before the data frame is send out, and the decoding latency is also smaller.

The operations of apparatus 500 are same with those of the method 200 described with respect to FIG. 2, and thus, will not be detailed herein.

It is appreciated that in an embodiment, steps of the method 200 in FIG. 2 and units of the apparatus in FIG. 5 may be implemented mainly in software code. Alternatively, in other embodiment, the above method steps and units can be performed by the combination of hardware and software.

According to another aspect of the present invention, burst errors can be corrected mainly by hardware, such as by using application specific integrated circuit (ASIC). Thus, the embodiments of the present invention also provide a decoder for correcting burst errors.

Figure 6:
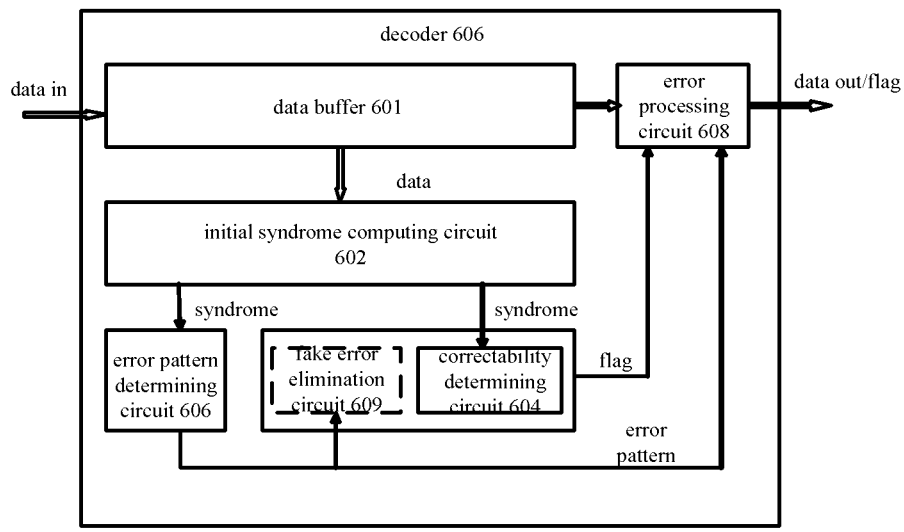
FIG. 6 shows overall structure of a decoder according to an embodiment of the present invention.

FIG. 6 shows overall structure of a decoder 600 according to an embodiment of the present invention. As shown in FIG. 6, the decoder 600 comprises: a data buffer 601, configured for storing a received data frame, wherein the data frame is encoded according to cyclic codes for correcting burst error; an initial syndrome computing circuit 602, configured for reading out the data frame from the data buffer 601 and computing an initial syndrome of the data frame; an error correctability determining circuit 604, comprising a plurality of multiplexers and a XOR gate, and configured for determining error correctability of burst error contained in the data frame based on the initial syndrome computed by the initial syndrome computing circuit; and an error processing circuit 608, configured for processing the burst error in the data frame and outputting the processed data frame based on the error correctability determined by the error correctability determining circuit.

The data buffer 601 can be implemented with any appropriate existing technology and thus, its internal structure will be not be detained herein. In the present example, the size of the data buffer 601 is equal to the length of one data frame, i.e., n bits.

The decoder 600 may further comprise an error pattern determining circuit 606, configured for determining error pattern of the burst error contained in the data frame based on the initial syndrome computed by the initial syndrome computing circuit 602.

In an example, the error processing circuit 608 is further configured for processing the burst error in the data frame based on the error correctability determined by the error correctability circuit 604 and the error pattern determined by the error pattern determining circuit 606.

Figure 7:
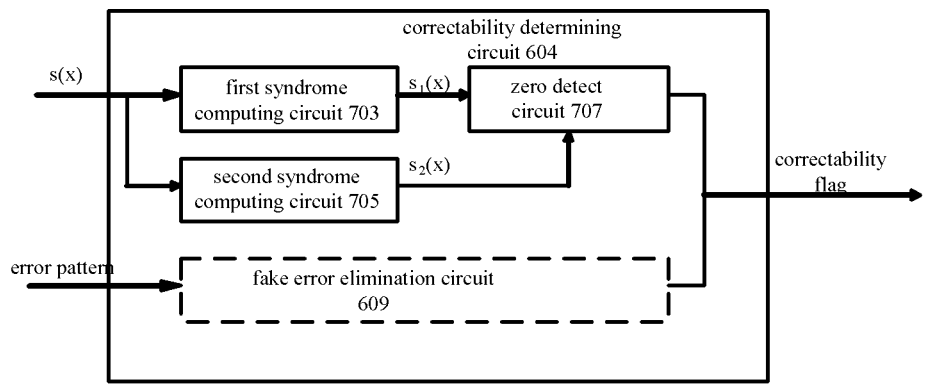
FIG. 7 shows a block diagram of error correctability determining circuit according to an embodiment of the present invention.

FIG. 7 shows a block diagram of an error correctability determining circuit 604 according to an embodiment of the present invention. As shown in FIG. 7, the error correctability determining circuit 604 comprises: a first syndrome computing circuit 703, comprising one or more multiplexers and a XOR gate, and configured for computing a first syndrome with an error pattern polynomial based on the initial syndrome computed by the initial syndrome computing circuit 602; a second syndrome computing circuit 705, comprising one or more multiplexers and a XOR gate, and configured for computing a second syndrome with an error location polynomial based on the initial syndrome computed by the initial syndrome computing circuit 602; and a zero detect circuit 707, configured for determining error correctability of the burst error contained in the data frame with a predetermined rule based on the first syndrome computed by the first syndrome computing circuit 703 and the second syndrome computed by the second syndrome computing circuit 705 respectively.

In an example, the first syndrome computing circuit 703 is further configured for: dividing the initial syndrome computed by the initial syndrome computing circuit 602 by the error pattern polynomial through using the one or more multiplexers and XOR gate, and determining the remaining polynomial as the first syndrome. In an example, dividing the initial syndrome computed by the initial syndrome computing circuit 602 by the error pattern polynomial comprises: performing shift operation on terms in the initial syndrome computed by the initial syndrome computing circuit 602 with order higher than the highest order in the error pattern polynomial through using the multiplexer; and performing subtract operation on results of the shift operation and terms in the initial syndrome with order not higher than the highest order of the error pattern polynomial through using the XOR gate.

In an example, the second syndrome computing circuit 705 is further configured for: dividing the initial syndrome computed by the initial syndrome computing circuit 602 by the error location polynomial through using the one or more multiplexers and XOR gate; and determining the remaining polynomial as the second syndrome. In an example, dividing the initial syndrome computed by the initial syndrome computing circuit 602 by the error location polynomial comprises: performing shift operation on terms in the initial syndrome computed by the initial syndrome computing circuit 602 with order higher than the highest order in the error location polynomial through using the one or more multiplexers; and performing subtract operation on results of the shift operation and items in the initial syndrome with order not higher than the highest order of the error location polynomial through using the XOR gate.

Figure 8A:
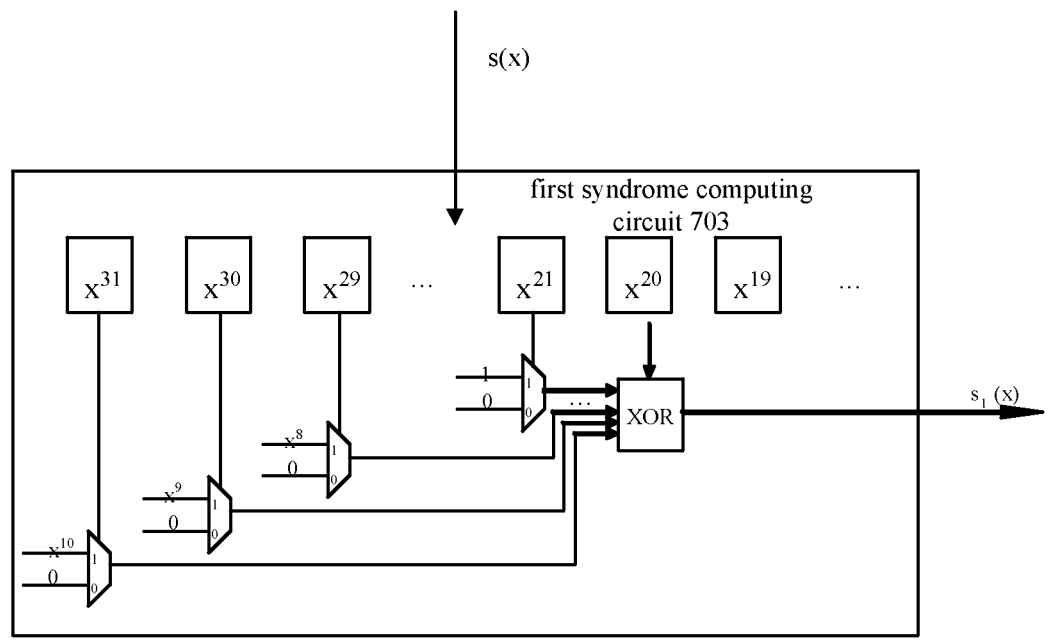
FIG. 8A and FIG. 8B show illustrative structure of a first syndrome computing circuit and a second syndrome computing circuit according to an embodiment of the present invention respectively.
Figure 8B:
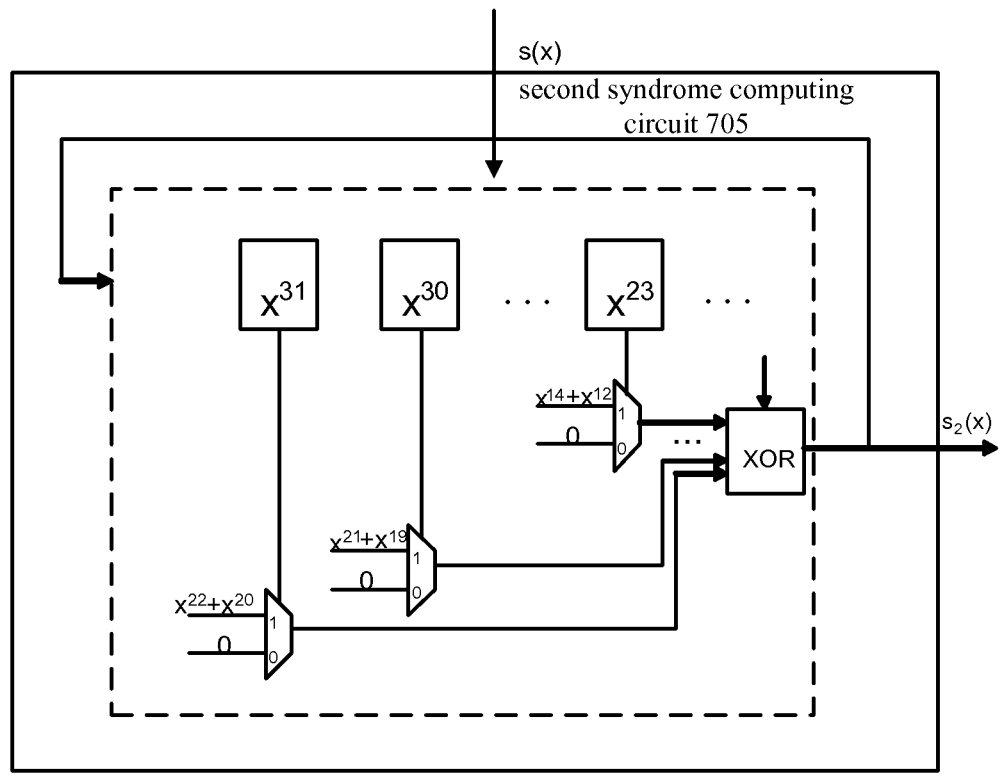

Below, IEEE 802.3ap will be taken as an example to describe a first syndrome computing circuit and a second syndrome computing circuit according to an embodiment of the present invention with respect to FIG. 8A and FIG. 8B. FIG. 8A and FIG. 8B show illustrative structure of a first syndrome computing circuit 703 and a second syndrome computing circuit 705 according to an embodiment of the present invention respectively. Where FIG. 8A implements the first syndrome computing circuit 703, i.e., implementing $s_1(x)=s(x) \mod (x^{21}+1)$ and FIG. 8B implements the second syndrome computing circuit 705, i.e., implementing $s_2(x)=s(x) \mod (x^{11}+x^2+1)$.

In FIG. 8A, 11 (i.e. L) 2-1 multiplexers and one XOR gate are used to implement the computation of the first syndrome. The principle of FIG. 8A will be described below. Given that there are only two terms in polynomial $(x^{21}+1)$, i.e., $x^{21}$ and 1, and s(x) has the highest degree 31, i.e., $x^{31}$, multiply $(x^{21}+1)$ with $x^{10}$, and the result will be $(x^{31}+x^{10})$. The above operation is equivalent to perform shift operation on the term $x^{31}$. The first term $x^{31}$ can eliminate the highest term in s(x), and the second term $x^{10}$ is irreducible to $(x^{21}+1)$, so it will be part of the remainder if there is not any other term with degree of 10, otherwise $x^{10}$ can be ignored from final result. Following this method, all the terms in s(x) with order $>=21$ can be eliminated, the terms with order 20~11 will be kept, and the terms with order $<=10$ will depend on whether s(x) involves related terms with high order, e.g., if s(x) involves $x^{31}$ and $x^{10}$, both of them will not appear in the final result.

The concrete operations used to implement the above computations will be described with respect to the circuit shown in FIG. 8A below.

First, terms in s(x) with the order equal and higher than 21 will be used as gate signal of the 11 multiplexers respectively. Take the term $x^{31}$ as an example, when $x^{31}$ exists in s(x), the corresponding multiplexers will choose a 21 bits signal with the $10^{th}$ bit being 1, while the other bits being 0 as its output. When $x^{31}$ does not exist in s(x), the corresponding multiplexers will choose a 21 bits signal with all 0 as its output. For the other terms $x^{30} \sim x^{21}$, there are similar computations.

Then the outputs of the multiplexers (all are 21 bits data) are inputted to respective inputs of the XOR gate, and the additional input of the XOR gate is the terms in s(x) with order less than 21, i.e., $x^{20} \sim 1$, which is also a 21 bits data. Finally, the XOR gate performs XOR operations on the respective inputs, and thus, a first syndrome $s_1(x)$ is gotten.

It should be noted that the operations are performed for terms in s(x) with order larger than 20 (i.e., $x^{31} \sim x^{21}$) in parallel in the above, that is, 11 (i.e. L) multiplexers are used, such that the first syndrome $s_1(x)$ is gotten. However, those skilled in the art will appreciate that other number of multiplexers can be used, for example one multiplexer. In such a case, operations are performed for terms in s(x) with order larger than 20 one by one. Then after 11 (i.e. L) times of operations, the final results (the first syndrome $s_1(x)$) will be obtained. The circuit structure in such a case is similar with that as shown in FIG. 8A, the only difference is only one multiplexer is used, and operations is performed for only one of terms in s(x) with order larger than 20 (i.e., $x^{30} \sim x^{21}$) each time.

Similarly, the circuits shown in FIG. 8B implements the computation of the second syndrome by using 9 (i.e. L-2) 2-1 multiplexers and one XOR gate. Similar with that in FIG. 8A, to eliminate $x^{31}$, extra term $x^{22}+x^{20}$ will be generated, so the first step is to eliminate terms in s(x) with order larger than 22, and the result whose highest term is 22 is marked as intermediate result, and then do similar step for the intermediate result, that is, extra term $x^{13}+x^2$ will be generated for $x^{22}$, and so on. The result polynomial is of degree 13 or less. After similar processing of the third time, the remainder of s(x) modulo $(x^{11}+x^2+1)$ can be calculated, which is the second syndrome $s_2(x)$.

It should be noted that the operations are performed for terms in s(x) with order larger than 22 (i.e., $x^{31} \sim x^{23}$) in parallel in the above, that is, 9 (i.e. L-2) multiplexers are used, such that the second syndrome $s_2(x)$ is gotten. However, those skilled in the art will appreciate that other number of multiplexers can be used, for example, one multiplexer. In such a case, operations are performed for terms in s(x) with order larger than 2L one by one. Then after 9 (i.e. L-2) times of operations, the final results will be obtained, that is, the second syndrome $s_2(x)$. The circuit structure in such a case is similar with that in FIG. 8B, the only difference is only 1 multiplexer is used, and operations is performed for one of terms in s(x) with order larger than 22 each time.

The above is described by taking IEE 802.3ap as an example, that is with its generation polynomial $g(x)=(x^{21}+1)(x^{11}+x^2+1)$. However, those skilled in the art will appreciate that similar methods can be used for the general from of the generation polynomial $g(x)=(x^{2L-1}+1)p(x)$.

After obtaining the first syndrome $s_1(x)$ and the second syndrome $s_2(x)$ by using the first syndrome computing circuit 703 and the second syndrome computing circuit 705, a zero detect circuit 707 can be used to determine error correctability of bust error according to a predetermined rule.

If it is determined by the zero detect circuit 707 that $s_1(x)=0$ and $s_2(x)=0$, it shows that no error is detected with the received code word r(x), thereby outputting a flag indicating that no error is detected.

If it is determined by the zero detect circuit 707 that $s_1(x)=0$ and $s_2(x) \neq 0$, or $s_1(x) \neq 0$ and $s_2(x)=0$, it shows that burst error is detected and the burst error is uncorrectable, thereby outputting a flag indicating the burst error is detected, and the burst error is uncorrectable.

If it is determined by the zero detect circuit 707 that $s_1(x) \neq 0$ and $s_2(x) \neq 0$, then it is determined whether the successive 0 in $s_1(x)$ is less or equal to L-1 at first, if yes, it shows that the burst error is uncorrectable, and thereby outputting a flag indicating that the burst error is uncorrectable; otherwise, it shows that the burst error is correctable, and thereby outputting a flag indicating the burst error is correctable. It should be noted that when determining whether the successive 0s in $s_1(x)$ is less or equal to L-1, it might be required to perform cyclic shift operations on the first syndrome $s_1(x)$, and determine whether the successive 0s in shifted $s_1(x)$ is less or equal to L-1. Since the highest order in $s_1(x)$ is 2L-1, 2L-2 shift operations are needed at most.

From the above, it can be seen that with the decoder of the present invention, two module operations and 2L−2 shift operations are need to determine the error correctability of the burst error.

Given the above, with the decoder of the present invention, two module operations can be performed to obtain the first syndrome and second syndrome, thus determining whether the burst error contained in the data frame is correctable with a predetermined rule. Where the module operation of the first syndrome is implemented by using L 2−1 multiplexers and one XOR gate, and the module operation of the second syndrome is implemented by using L−2 2−1 multiplexers and one XOR gate. It can be seen that the scheme of the decoder according to the present invention is simple and has smaller decoding latency.

The concrete implementation of the first and second syndrome computing circuits are shown in FIG. 8A and FIG. 8B. However, it should be noted that FIG. 8A and FIG. 8B are merely illustrative, they intend to illustrate implementing the first and second syndrome computing circuits by using multiplexers and XOR gate. That is, using multiplexer and XOR gate instead of divider to implement the module operation.

Those skilled in the art will appreciate that when using multiplexers and XOR gate to implement the module operation, the number and connections of the multiplexers and XOR gate are not limited to those as shown in FIG. 8A and FIG. 8B. Instead, when implementing the first and second syndrome computing circuits, those skilled in the art may modify the number and connections of the multiplexers and XOR gate shown in FIG. 8A and FIG. 8B, so as to achieve the aim of using multiplexer and XOR gate instead of divider to implement obtain the first and second syndrome. Moreover, FIG. 8A and FIG. 8B may comprise additional components, such as registers for registering the initial syndrome.

Figure 9:
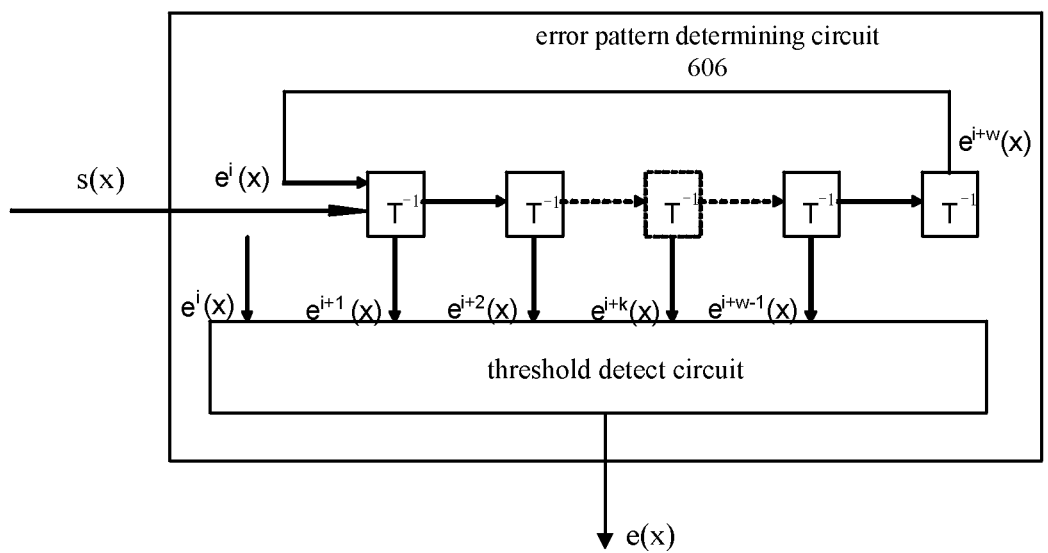
FIG. 9 shows the structure of an error pattern determining circuit according to an embodiment of the present invention.

FIG. 9 shows the structure of an error pattern determining circuit 606 according to an embodiment of the present invention. The error pattern determining circuit 606 receives s(x) as its initial value and outputs valid error pattern after calculations. In particular, operations performed by the circuit 606 may comprise the below.

First, candidate error patterns are computed based on the equation $e^{i+1}(x)=T^{-1} \cdot e^i(x)$, wherein the initial value of $e^i(x)$ is the computed initial syndrome s(x) of the data frame; i equals to integral times of the data width w, such as 1, w, 2w . . . ; the data width w is determined by the lower and upper levels. For example, w can be 16, 32, 64, etc.

Next, the obtained candidate error patterns $e^i(x)$, $e^{i+1}(x)$, . . . , $e^{i+w-1}(x)$ are send to a threshold detect circuit. The threshold detect circuit determines whether there is an e(x) in the candidate error patterns which has at least 2L−1 successive 0s.

If there is such a candidate error pattern, said candidate error pattern will be determined as the error pattern of the data frame and the iteration will be stopped.

Otherwise, if there is not such as a candidate error pattern, then $e^{i+w}(x)$ will be feed back to the input and the above steps will be repeated, until a valid error pattern e(x) is found.

Thus, it can be seen that with the present invention, the error pattern can be determined by multiplication of matrix. Those skilled in the art will appreciate that in combination logic, multiplication on GF (2) can be implemented by XOR gate. Thus the implementation is convenient.

Thus, with the decoder of the present invention, error correctability and error pattern of burst error contained in data frame can be determined by using initial syndrome of the data frame, such that a flag indicating whether the data frame is correctable can be send out while the head of the data frame is send out. With the decoder of the present invention, the overall decoding latency can be controlled to be a slightly larger than one frame latency.

The above is applicable to non-shorten cyclic codes. For shorten cyclic codes, the error correctability determined by the zero detect circuit 707 with the predetermined rule is defined as a first error correctability, and the decoder 600 also comprises a fake error elimination circuit 609, configured for: judging whether the burst error occurs at boundary of the shorten frame of the shorten cyclic codes based on location of the burst error in the data frame; in response to judging that the burst error occurs at boundary of the shorten frame of the shorten cyclic codes, determining a second error correctability; and determining the error correctability of the burst error contained in the data frame based on the determined first and second error correctability. However, it will not result in many additional complex computations and a large decoding latency when compared with non-shorten cyclic codes.

Given the above, both in the case of cyclic codes and shorten cyclic codes, error correctability of burst error contained in a data frame can be determined with a small amount of computations and a small decoding latency. Thus, a flag indicating whether the data frame is correctable can be send out while the head of the data frame is send out. That is, with the decoder of the present invention, the error correctability of burst error contained in the data frame can be determined before the data frame is send out, and the decoding latency is also smaller.

Figure 10A:
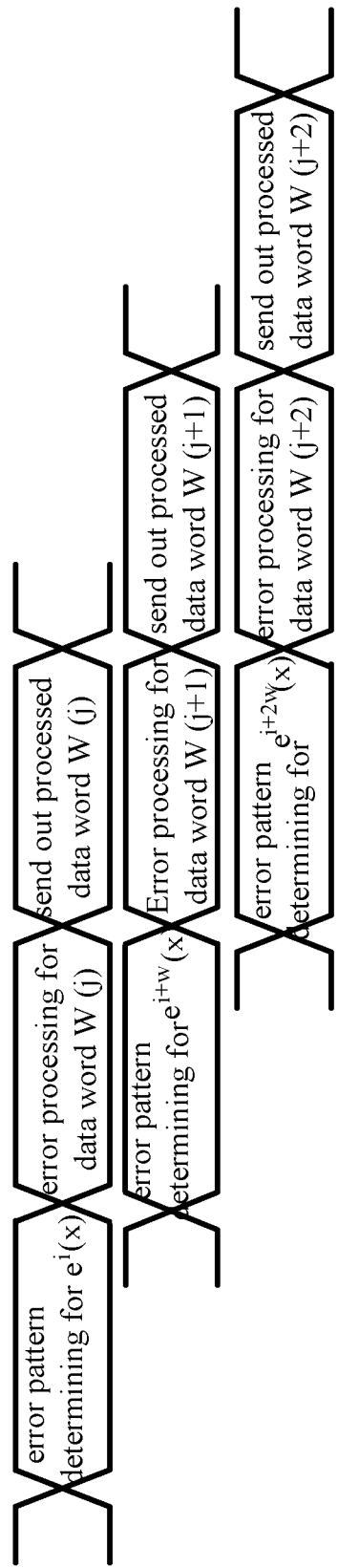
FIG. 10A and FIG. 10B show pipeline controls at the level of intra-frame and interframe according to an embodiment of the present invention respectively.
Figure 10B:
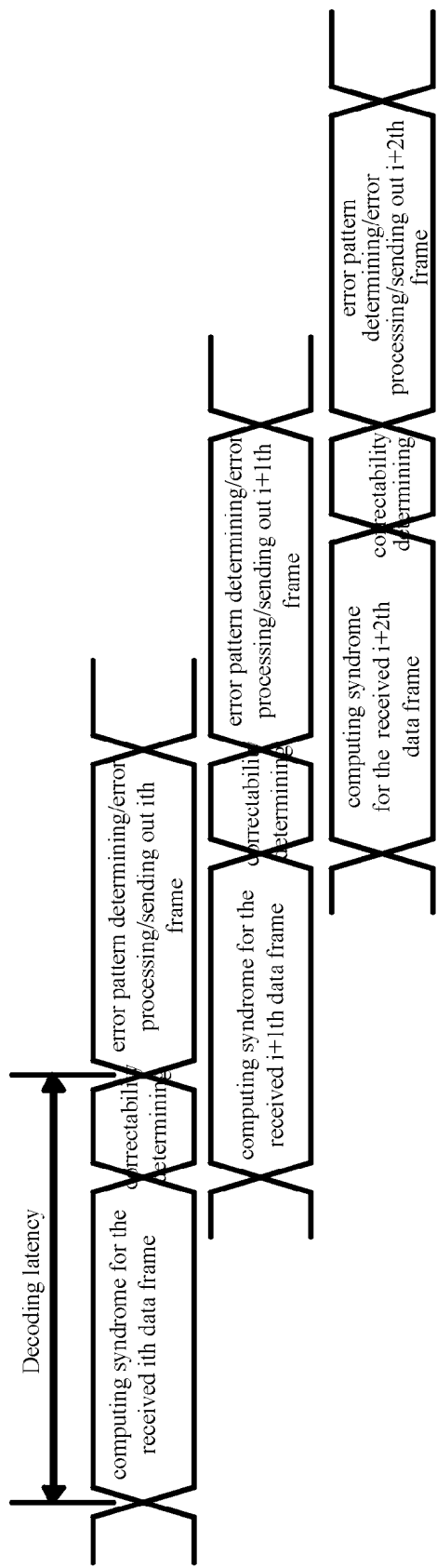

FIG. 10A and FIG. 10B show pipeline controls at the level of intra-frame and interframe according to an embodiment of the present invention respectively.

FIG. 10A shows using pipeline among error pattern determining/error processing/data word sending out. After error pattern determining for $e^i(x)$, the related data word W(j) is processed and send out immediately. When processing errors for the data word W(j), the error pattern determining for W(j+1) (i.e., $e^{i+w}$) is performed at the same time. When sending out data word W(j), error processing is performed for data word W(j+1).

It should be noted that a data frame is comprised of data words, and that data width w of the data word can be determined by lower and upper levels. For example, data word can be 16, 32 or 64 bits in length. For example, for cyclic codes (i.e., data frame) with 2112 bits in length, it is comprised of 66 32-bits data words. In such an instance, i equals to integral times of the data width w, such as 0, 32, 64 . . . ; the data width w is determined by lower and upper levels, such as 16, 32 or 64 etc. j is natural number equal or larger than 1 and less than 66.

FIG. 10B shows using pipeline among initial syndrome computing, correctability determining and error pattern determining/error processing/data word sending out. Syndrome computing can be performed continuously based on the input data frame, and the corresponding correctability determining and error pattern determining/error processing/data word sending out can be performed subsequently.

Based on the pipeline controls in FIG. 10A and FIG. 10B, about one frame time originally consumed by error pattern determining can be greatly reduced to a few clock cycles, thus, the whole decoding latency will be reduced greatly to around one frame time, which is mainly consumed by syndrome generation. Moreover, the embodiment of the present invention also brings up great area reduction since data buffer can be cut into a half, i.e., only the size of one frame of data.

Table 1 as below shows the comparisons between the decoding scheme of the present invention and that of the prior art.

TABLE

|  | Decoding scheme of the present invention | Meggitt Decoding scheme | Fire Code decoding scheme |
|---|---|---|---|
| buffer size | n bits | 2n bits | n + P bits |
| shift operations to get syndrome | n times | n times | 0 |
| shift operations to determine error correctability | 2L-2 times | n times | 0 |
| shift operations to determine error pattern | 0 | n times | 0 |
| shift operations to get error pattern polynomial and error location polynomial | / | / | n times |
| shift operations to get valid error pattern and error position | / | / | 2L + P-3 times |
| real number add operation | 0 | 0 | 1 |
| real number multiply operation | 0 | 0 | 2 |
| module operation | 2 | 0 | 1 |

In table 1, n is the length of the data frame, L is the maximum length of the burst errors that the cyclic codes according to which the data frame is encoded can correct, and P is associated with the period of primitive polynomial p(x).

With the decoding method, decoding apparatus and decoder of the present invention, error correctability of burst error contained in a data frame can be determined before the data is send out, while having smaller decoding latency, through determining error correctability and error pattern of the burst error contained in the data frame using initial syndrome of the data frame.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A decoding method for correcting burst errors comprising:
    computing an initial syndrome of a received data frame, wherein the data frame is encoded according to cyclic codes for correcting burst errors;
    determining error correctability of a burst error contained in the data frame based on the computed initial syndrome;
    processing the burst error in the data frame and outputting the processed data frame based on the determined error correctability;
    computing a first syndrome by dividing the computed initial syndrome by an error pattern polynomial and determining a remaining polynomial associated with the first syndrome; and
    computing a second syndrome by dividing the computed initial syndrome by an error location polynomial, and determining a remaining polynomial associated with the second syndrome,
    wherein determining the error correctability of the burst error contained in the data frame comprises:
    computing the first syndrome with the error pattern polynomial based on the computed initial syndrome;
    computing the second syndrome with the error location polynomial, based on the computed initial syndrome, wherein the error pattern polynomial and the error location polynomial are associated with a generation polynomial of the cyclic codes; and determining the error correctability of the burst error contained in the data frame with a predetermined rule based on the computed first and second syndromes, and
    wherein the cyclic codes are shorten cyclic codes, and the determined error correctability determined with the predetermined rule is defined as a first error correctability, and determining the error correctability based on the computed initial syndrome further comprises:
    judging whether the burst error occurs at a boundary of a shorten frame of the shorten cyclic codes based on a location of the burst error in the data frame;
    in response to judging that the burst error occurs at the boundary of the shorten frame of the shorten cyclic codes, determining a second error correctability; and
    determining the error correctability of the burst error contained in the data frame based on the determined first and second error correctability.

2. The decoding method according to claim 1, wherein dividing the computed initial syndrome by the error pattern polynomial comprises:
    performing a shift operation on terms in the initial syndrome with orders higher than the highest order in the error pattern polynomial; and
    performing a subtract operation on results of the shift operation and terms in the initial syndrome with orders not higher than the highest order of the error pattern polynomial.

3. The decoding method according to claim 1, wherein dividing the computed initial syndrome by the error location polynomial comprises:

performing a shift operation on terms in the initial syndrome with orders higher than the highest order in the error location polynomial; and performing a subtract operation on results of the shift operation and items in the initial syndrome with orders not higher than the highest order of the error location polynomial.

4. The decoding method according to claim 1, further comprising:

determining an error pattern of the burst error contained in the data frame based on the computed initial syndrome, and wherein processing the burst error in the data frame comprises processing the burst error in the data frame based on the determined error correctability and the error pattern.

5. A decoder for correcting burst errors comprising:

a data buffer configured for storing a received data frame, wherein the data frame is encoded according to cyclic codes for correcting burst errors;

an initial syndrome computing circuit configured for reading out the data frame from the data buffer and computing an initial syndrome of the data frame;

an error correctability determining circuit, comprising a plurality of multiplexers and an XOR gate, and configured for determining error correctability of the burst error contained in the data frame based on the computed initial syndrome;

an error processing circuit configured for processing the burst error in the data frame and outputting the processed data frame based on the determined error correctability;

a first syndrome computing circuit which computes a first syndrome by dividing the computed initial syndrome by an error pattern polynomial, and determining the remaining polynomial as the first syndrome; and a second syndrome computing circuit which computes a second syndrome by dividing the computed initial syndrome by an error location polynomial, and determining the remaining polynomial as the second syndrome, wherein the cyclic codes are Fire Codes with a generation polynomial $g(x)=(x^{2L-1}+1)\ p(x)$, wherein $p(x)$ is a primitive polynomial and Galois field arithmetic is performed in $GF(2^m)$, wherein m is an order of $p(x)$, and wherein L is a positive integer less than or equal to m, and wherein 2L−1 is not divisible by a period of $p(x)$; and wherein $(x^{2L-1}+1)$ is an error pattern polynomial, and $p(x)$ is an error location polynomial.

6. The decoder according to claim 5, wherein the error correctability determining circuit comprises:

the first syndrome computing circuit-which comprises a multiplexer and an XOR gate, and configured for computing the first syndrome with the error pattern polynomial based on the initial syndrome computed by the initial syndrome computing circuit;

the second syndrome computing circuit which comprises a multiplexer and an XOR gate, and configured for computing the second syndrome with the error location polynomial based on the initial syndrome computed by the initial syndrome computing circuit; and a zero detect circuit, configured for determining the error correctability of the burst error contained in the data frame with a predetermined rule based on the first and second syndromes computed by the first and second syndrome computing circuits respectively.

7. The decoder according to claim 6, wherein the first syndrome computing circuit is further configured for dividing the initial syndrome computed by the initial syndrome computing circuit by the error pattern polynomial using the multiplexer and XOR gate of the first syndrome computing circuit, and determining the remaining polynomial as the first syndrome.

8. The decoder according to claim 7, wherein dividing the computed initial syndrome by the error pattern polynomial comprises:

performing a shift operation on terms in the initial syndrome computed by the initial syndrome computing circuit with orders higher than a highest order in the error pattern polynomial using the multiplexer of the first syndrome computing circuit; and performing a subtract operation on results of the shift operation and terms in the initial syndrome with orders not higher than the highest order of the error pattern polynomial by using the XOR gate of the first syndrome computing circuit.

* * * * *